United States Patent
Gao et al.

(10) Patent No.: US 9,577,644 B2
(45) Date of Patent: Feb. 21, 2017

(54) RECONFIGURABLE LOGIC ARCHITECTURE

(71) Applicant: Samsung Electronics Co., Ltd., Suwon-si, Gyeonggi-do (KR)

(72) Inventors: Mingyu Gao, Stanford, CA (US); Hongzhong Zheng, Sunnyvale, CA (US); Krishna T. Malladi, San Jose, CA (US); Robert Brennan, Santa Clara, CA (US)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/838,347

(22) Filed: Aug. 27, 2015

(65) Prior Publication Data

US 2016/0173101 A1    Jun. 16, 2016

Related U.S. Application Data

(60) Provisional application No. 62/092,819, filed on Dec. 16, 2014, provisional application No. 62/092,822, filed on Dec. 16, 2014, provisional application No. 62/092,825, filed on Dec. 16, 2014.

(51) Int. Cl.
*H03K 19/177*   (2006.01)
*G06F 7/38*   (2006.01)
*H01L 25/18*   (2006.01)
*H01L 25/00*   (2006.01)

(52) U.S. Cl.
CPC ......... *H03K 19/1776* (2013.01); *H01L 25/18* (2013.01); *H01L 25/50* (2013.01); *H03K 19/17728* (2013.01); *H03K 19/17736* (2013.01); *H01L 2924/0002* (2013.01)

(58) Field of Classification Search
CPC ..................... H03K 19/17728; H03K 19/1776
USPC ............................................. 326/39, 40, 46
See application file for complete search history.

(56) References Cited

U.S. PATENT DOCUMENTS

| | | | | | |
|---|---|---|---|---|---|
| 5,594,698 | A | * | 1/1997 | Freeman | G11C 7/1006 365/222 |
| 6,020,759 | A | * | 2/2000 | Heile | H03K 19/1776 326/37 |
| 7,129,749 | B1 | * | 10/2006 | Fenstermaker | H03K 19/17748 326/41 |
| 7,535,252 | B1 | * | 5/2009 | Teig | G06F 17/504 326/38 |

* cited by examiner

*Primary Examiner* — Daniel D Chang
(74) *Attorney, Agent, or Firm* — Renaissance IP Law Group LLP

(57) ABSTRACT

According to one general aspect, an apparatus may include a plurality of stacked integrated circuit dies. The dies may include a memory cell die configured to store data in a random access fashion. The dies may also include a look-up table die comprising a random access memory array that, in turn, includes a reconfigurable look-up table. The reconfigurable look-up table may be configured to perform a logic function. The reconfigurable look-up table may include a plurality of random access memory cells configured to store a look-up table to perform a logic function, and a local row decoder configured to activate one or more rows of memory cells based upon a set of input signals. The look-up table stored in the plurality of memory cells may be configured to be dynamically altered via a memory write operation to the random access memory array.

21 Claims, 7 Drawing Sheets

200

391

392

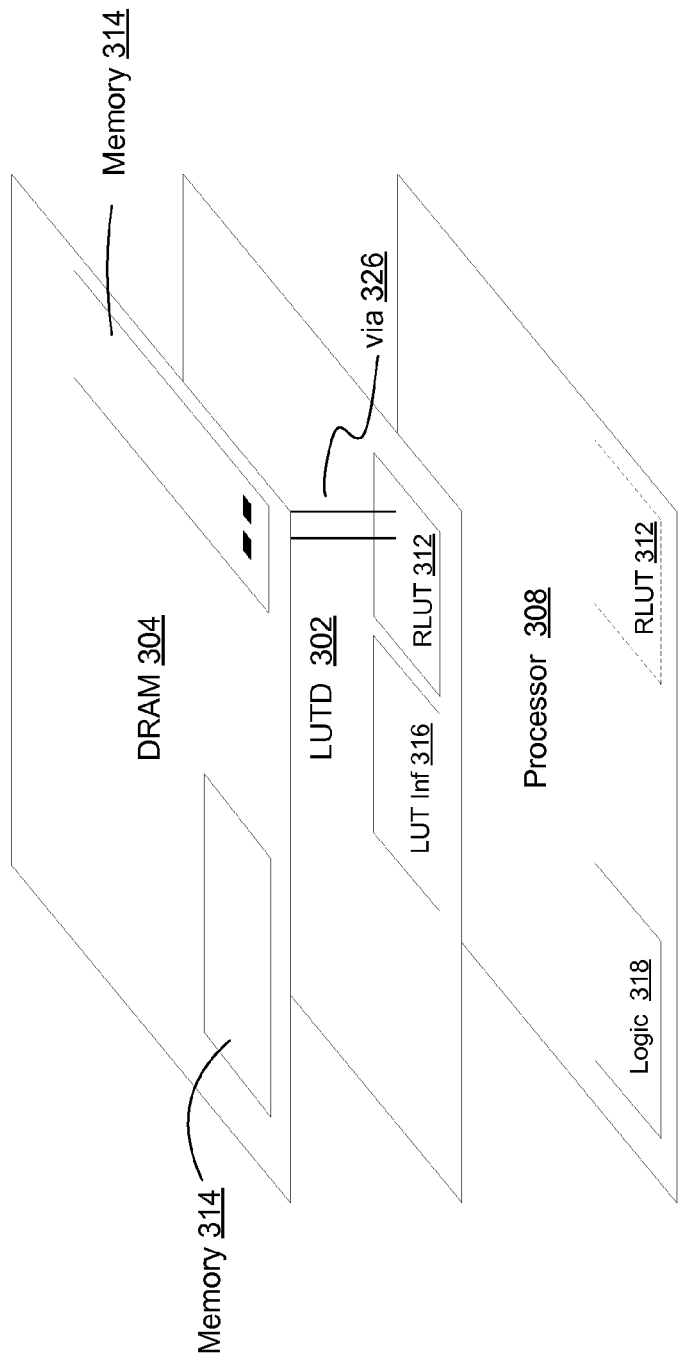

FIG. 4
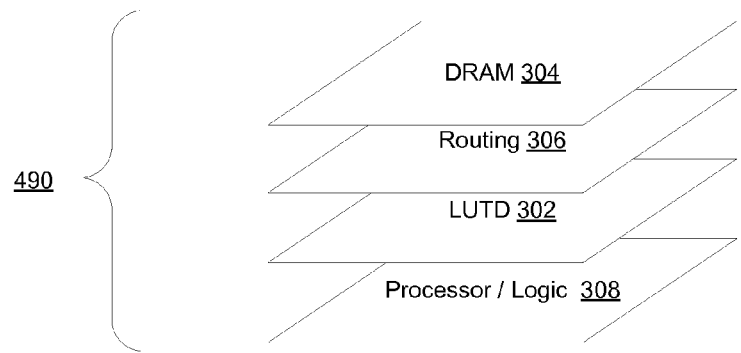
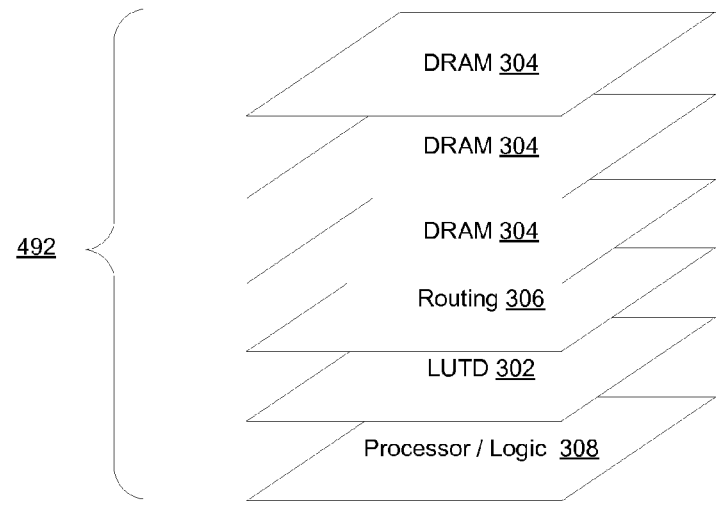
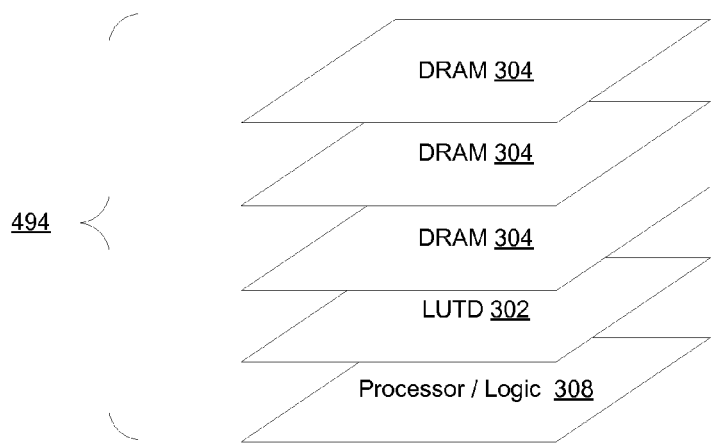

RECONFIGURABLE LOGIC ARCHITECTURE

CROSS-REFERENCE TO RELATED APPLICATION

This application claims priority under 35 U.S.C. §119 to Provisional Patent Application Ser. No. 62/092,819, entitled "DRAM-BASED RECONFIGURABLE LOGIC" filed on Dec. 16, 2014. The subject matter of this earlier filed application is hereby incorporated by reference.

This application claims priority under 35 U.S.C. §119 to Provisional Patent Application Ser. No. 62/092,822, entitled "HBM WITH DRAM-BASED RECONFIGURABLE LOGIC ARCHITECTURE" filed on Dec. 16, 2014. The subject matter of this earlier filed application is hereby incorporated by reference.

This application claims priority under 35 U.S.C. §119 to Provisional Patent Application Ser. No. 62/092,825, entitled "SPACE-MULTIPLEXING DRAM-BASED RECONFIGURABLE LOGIC" filed on Dec. 16, 2014. The subject matter of this earlier filed application is hereby incorporated by reference.

TECHNICAL FIELD

This description relates to computing technology, and more specifically to reconfigurable processing units.

BACKGROUND

Generally, a programmable logic device (PLD) is an electronic component used to build reconfigurable digital circuits. Unlike a logic gate or logic circuit, which generally has a fixed function, a PLD traditionally has an undefined function at the time of manufacture. Often, before the PLD can be used in a circuit it must be programmed, that is, reconfigured to perform a desired function.

Traditionally a PLD may include a combination of a logic device and a memory device. Generally, the memory is used to store a pattern that was given to the chip during programming. Most of the methods for storing data in an integrated circuit have been adapted for use in PLDs. These generally include silicon anti-fuses, static random access memory (SRAM), erasable programmable read only memory (EPROM), electronically EPROM (EEPROM), non-volatile RAM, etc. In general, most PLDs include components that are programed by applying an unusual level of voltage across a modified area of silicon inside the chip. This high level of voltage breaks or sets (depending on the technology) electrical connections and changes the layout of the electrical circuit.

One of the most common types of PLDs is a field-programmable gate array (FPGA). A FPGA is an integrated circuit designed to be configured by a customer or a designer after manufacturing—hence "field-programmable". The FPGA configuration is generally specified using a hardware description language (HDL), similar to that used for an application-specific integrated circuit (ASIC).

FPGAs include an array of programmable logic blocks, and a hierarchy of reconfigurable interconnects that allow the blocks to be "wired together". A FPGA's logic blocks can be configured to perform complex combinational functions, or merely simple logic gates like AND, XOR, etc.

SUMMARY

According to one general aspect, an apparatus may include a plurality of stacked integrated circuit dies. The dies may include a memory cell die configured to store data in a random access fashion. The dies may also include a look-up table die comprising a random access memory array that, in turn, includes a reconfigurable look-up table. The reconfigurable look-up table may be configured to perform a logic function. The reconfigurable look-up table may include a plurality of random access memory cells configured to store a look-up table to perform a logic function, and a local row decoder configured to activate one or more rows of memory cells based upon a set of input signals. The look-up table stored in the plurality of memory cells may be configured to be dynamically altered via a memory write operation to the random access memory array.

According to another general aspect, a system-on-a-chip (SoC) may include a look-up table die that includes a reconfigurable look-up table configured to perform a logic function. The reconfigurable look-up table may include a plurality of random access memory cells configured to store a look-up table to perform a logic function, wherein the look-up table is configured to be dynamically altered by a memory write operation to the random access memory cells. The SoC may include a processor die that includes a processor core, wherein the processor core is configured to off-load an execution of the logic function to the reconfigurable look-up table.

According to another general aspect, a method may include manufacturing, by a first fabrication technology, a memory cell die configured to store data in a random access fashion. The method may also include manufacturing, by a second fabrication technology, a look-up table die that includes a reconfigurable look-up table configured to perform a logic function. The reconfigurable look-up table may include a plurality of random access memory cells configured to store a look-up table to perform a logic function, wherein the look-up table is configured to be dynamically altered by a memory write operation to the random access memory cells. The method may further include physically coupling the memory cell die and the look-up table die into a stack of integrated circuit dies.

The details of one or more implementations are set forth in the accompanying drawings and the description below. Other features will be apparent from the description and drawings, and from the claims.

A system and/or method for computing technology, and more specifically to reconfigurable processing units, substantially as shown in and/or described in connection with at least one of the figures, as set forth more completely in the claims.

BRIEF DESCRIPTION OF THE DRAWINGS

FIG. 3c is an isometric block diagram of an example embodiment of a system in accordance with the disclosed subject matter.

FIG. 4 is an isometric block diagram of example embodiments of systems in accordance with the disclosed subject matter.

Like reference symbols in the various drawings indicate like elements.

DETAILED DESCRIPTION

Figure 1:
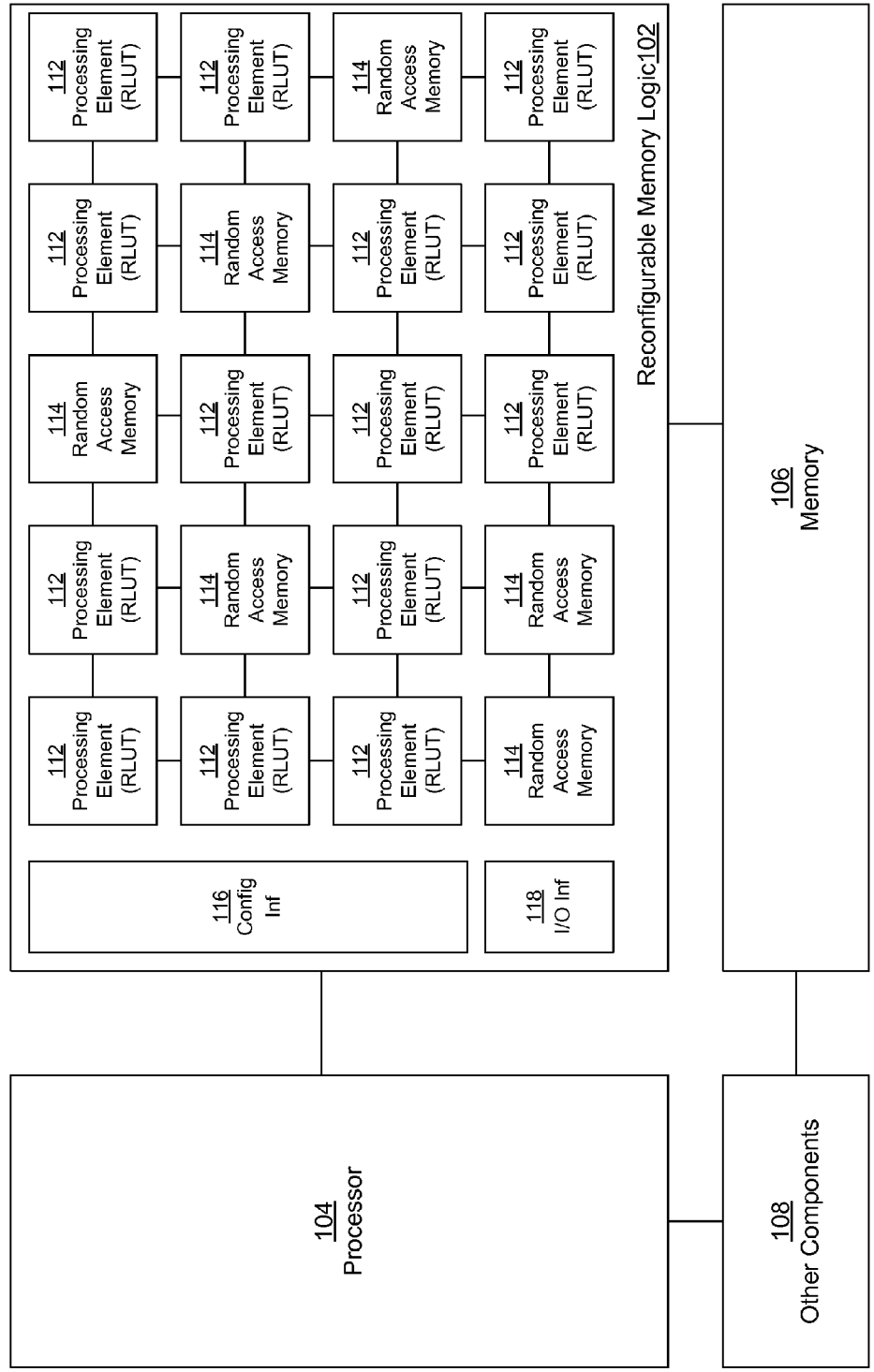
FIG. 1 is a block diagram of an example embodiment of a system in accordance with the disclosed subject matter.

Various example embodiments will be described more fully hereinafter with reference to the accompanying drawings, in which some example embodiments are shown. The present disclosed subject matter may, however, be embodied in many different forms and should not be construed as limited to the example embodiments set forth herein. Rather, these example embodiments are provided so that this disclosure will be thorough and complete, and will fully convey the scope of the present disclosed subject matter to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the present disclosed subject matter.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present disclosed subject matter. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present disclosed subject matter.

Unless otherwise defined, all terms (including technical and scientific terms) used herein have the same meaning as commonly understood by one of ordinary skill in the art to which this disclosed subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIG. 1 is a block diagram of an example embodiment of a system 100 in accordance with the disclosed subject matter. In various embodiments, the system 100 may include a processor 104, a memory 106, and a reconfigurable memory logic 102. In various embodiments, the system 108 may also include one or more other components 108 (e.g., a network interface, a memory controller, etc.).

In various embodiments, the system 100 may include a system on a chip (SoC). In another embodiment, the system 10 may include a series of discrete or individual components. In yet another embodiment, the system 100 may include a combination of integrated and discrete components. In various embodiments, the system 100 may include a computing device, such as, for example, a laptop, desktop, workstation, personal digital assistant, smartphone, tablet, and other appropriate computers, etc. or a virtual machine or virtual computing device thereof. In various embodiments, the system 100 may be used by a user (not shown).

In the illustrated embodiment, the processor 104 may be configured to execute one or more machine executable instructions or pieces of software, firmware, or a combination thereof. In such an embodiment, the processor 104 may include fixed logic circuits (e.g., AND gates, flip-flops, etc.) that are set during the manufacture of the processor 104 (or shortly thereafter, e.g., fuses, etc.) and may not be substantially changed after manufacture.

In various embodiments, the memory 106 may include a plurality of memory cells each configured to store one or more pieces of data, either temporarily, permanently, semi-permanently, or a combination thereof. The data in the memory 106 may be accessed by the processor 104. Further, the memory 106 may include volatile memory, non-volatile memory or a combination thereof.

In the illustrated embodiment, the system 100 may include a reconfigurable memory logic 102. The reconfigurable memory logic 102 may be similar to the memory 106 in that they may both include a number of memory cells (not explicitly shown) that are arranged in sub-arrays (illustrated as elements 112 and 114). Typically, a memory (e.g., an SRAM, a dynamic RAM (DRAM), etc.) includes an array of memory cells arranged into an array of rows and columns. Often, in order to make the larger array more manageable, the array may be divided into sub-arrays of memory cells (e.g., 256 rows by 256 columns, etc.). Traditionally, division of a memory array into sub-arrays may be advantageous because generally only one sub-array is accessed at a time, thus reducing power and computation complexity.

In the illustrated embodiment, the memory array (illustrated by the reconfigurable memory logic 102) may differ from the memory 106 in that the sub-arrays may be reconfigured to act as look-up tables (LUTs) instead of traditional memory sub-arrays. In such an embodiment, a logic function may be implemented in a LUT. For example, the LUT may perform an arithmetic logic function, such as that of an adder, multiplier, etc. It is understood that the above is merely one illustrative example to which the disclosed subject matter is not limited. In the illustrated embodiment, such LUTs may be referred to as processing elements or reconfigurable LUTs (RLUTs) 112.

In such an embodiment, a RLUT 112 and the logic function implemented therein may be altered by merely performing a memory write operation. This may allow logic functions to be reconfigured or altered dynamically during the operation of the system 100. The use of a traditional write operation (or similar) may allow for reprogramming without the need of an unusual (i.e., non-operational or high) voltage, such as those used for programming EEPROMs, etc.

In such an embodiment, the reconfigurable memory logic 102 may include a configuration interface 116. In various embodiments, when the processor 104 (or other component) wishes to change or alter the logic function stored in the RLUT 112, it may perform a write operation or a special write operation (e.g., a write operation that includes an indicator that it involves a RLUT 112, etc.).

In some embodiments, all memory accesses or operations may pass through the reconfigurable memory logic 102's input/output (I/O) interface 118. In such an embodiment, if the memory access is to a sub-array that stores data for revival (e.g., a RAM sub-array 114, etc.), the I/O interface 118 may simply process the read/write request as a memory array traditionally would. However, in some embodiments, if the memory access is to a sub-array that is employed as a RLUT 112 (or will be employed as a RLUT 112), the I/O interface 118 may pass that memory access to the configuration interface 116 for processing.

In yet another embodiment, the I/O interface 118 may be configured to read or write to the RLUT 112. In such an embodiment, the write access may involve writing to the RLUT 112 to define the logical function thereof. In such an embodiment, the configuration interface 116 may be configured to adjust the routing of signals within the RLUT 112 or the reconfigurable memory logic 102 as a whole. For example, the configuration interface 116 may be configured to adjust the routing of signals between multiple RLUT 112 and/or the RAM 114s. In such an embodiment, the I/O interface 118 may be configured to manage data access to the RLUT 112s and RAMs 114, and the configuration interface 116 may be configured to manage the interconnects and routing of the sub-arrays 112 & 114. It is understood that the above are merely a few illustrative examples to which the disclosed subject matter is not limited. In various embodiments, the I/O interface 118 may include the configuration interface 116.

Further, in the illustrated embodiment, each sub-array may be utilized as either a RLUT 112 or as a traditional RAM 114 memory sub-array. As described above, a traditional RAM 114 sub-array may be configured to store data and information. In such an embodiment, the number of or balance between RLUTs 112 and RAM subarrays 114 may be dynamically adjusted within the reconfigurable memory logic 102 as desired. In another embodiment, the number of RLUTs 112 and RAM sub-arrays 114 may be fixed during manufacture. In yet another embodiment, a maximum number of RLUTs 112 may be fixed during manufacture but the RLUTs 112 may be configurable to operate as RAM sub-arrays 114. It is understood that the above are merely a few illustrative examples to which the disclosed subject matter is not limited.

In various embodiments, the processor 104 (or other component) may wish to configure a sub-array as a RLUT 112. In such an embodiment, the processor 104 may make a memory access to the reconfigurable memory logic 102. The memory access may include a write operation that stores a look-up table in a particular RLUT 112. The memory access may include a series of memory accesses depending upon the size of the LUT. In some embodiments, particular memory accesses may indicate the number of inputs to the LUT and the number of outputs from the LUT. In addition, further memory accesses may indicate signal routing information regarding the RLUT 112. For example, as described below, multiple RLUTs 112 may be cascaded or otherwise routed together to perform logical functions (e.g., an adder, etc.).

Conversely, the processor 104 (or other component) may wish to configure a sub-array as a RAM 114. In which case, the memory accesses may instruct the configuration interface 116 to re-configure the RLUT 112 back to a standard RAM 114. In some embodiments, a predefined memory cell may be configured to store a bit that indicates whether or not the sub-array is currently functioning as a RLUT 112 or a RAM 114. In various embodiments, that indication bit may be included in the sub-array or the configuration interface 116. It is understood that the above are merely a few illustrative examples to which the disclosed subject matter is not limited.

In various embodiments, the reconfigurable memory logic 102 may include dynamic RAM (DRAM). This may differ from the traditional FPGA or PLD technology in that the RLUT 112s may be reprogrammed by normal memory access operations and without the need to resort to special voltages (e.g., to burn fuses, or set transistors, etc.).

In such an embodiment, by basing the RLUTs 112 on DRAM subarrays a higher density may be archived, compared to an SRAM-based FPGA. For example, the DRAM RLUT 112 may require only one transistor and one capacitor (1T1C) per memory cell or bit of information, compared to the SRAM's need for six transistors (6T). In another embodiment, the DRAM RLUT 112s may result in a lower cost compared to SRAM or Flash-based FPGAs.

As the RLUT 112 may be modified by a traditional memory access (or a variant thereof), the RLUT 112 may be self-modifying. For example, the outputs of one clock-cycle's RLUT 112 computation may result in a memory access that re-configures or updates the RLUT 112 to perform a second computational function. In another embodiment, the outputs of a RLUT 112 may be feedback as inputs to the same RLUT 112 in a way that modifies the RLUT 112's behavior.

In addition, in various embodiments, the co-mingling of the DRAM RLUTs 112 and RAMs 114 may provide advantages. For example, the close proximity to the data stored in the RAM 114, may speed the computation performed by the RLUT 112, and lower the power requirements as data need not be moved across busses. In some embodiments, by basing the RLUT 112 upon DRAM-technology similar to that used to create the processor 104 and memory 106, the RLUT 112s may exist within the same die or package as the processor 104 and/or memory 106. As such, the near-data computing provided by the DRAM RLUT 112s may be faster and more efficient. In addition, the same manufacturing process may lower the cost of the production of system 100. It is understood that the above are merely a few illustrative examples to which the disclosed subject matter is not limited.

Figure 2:
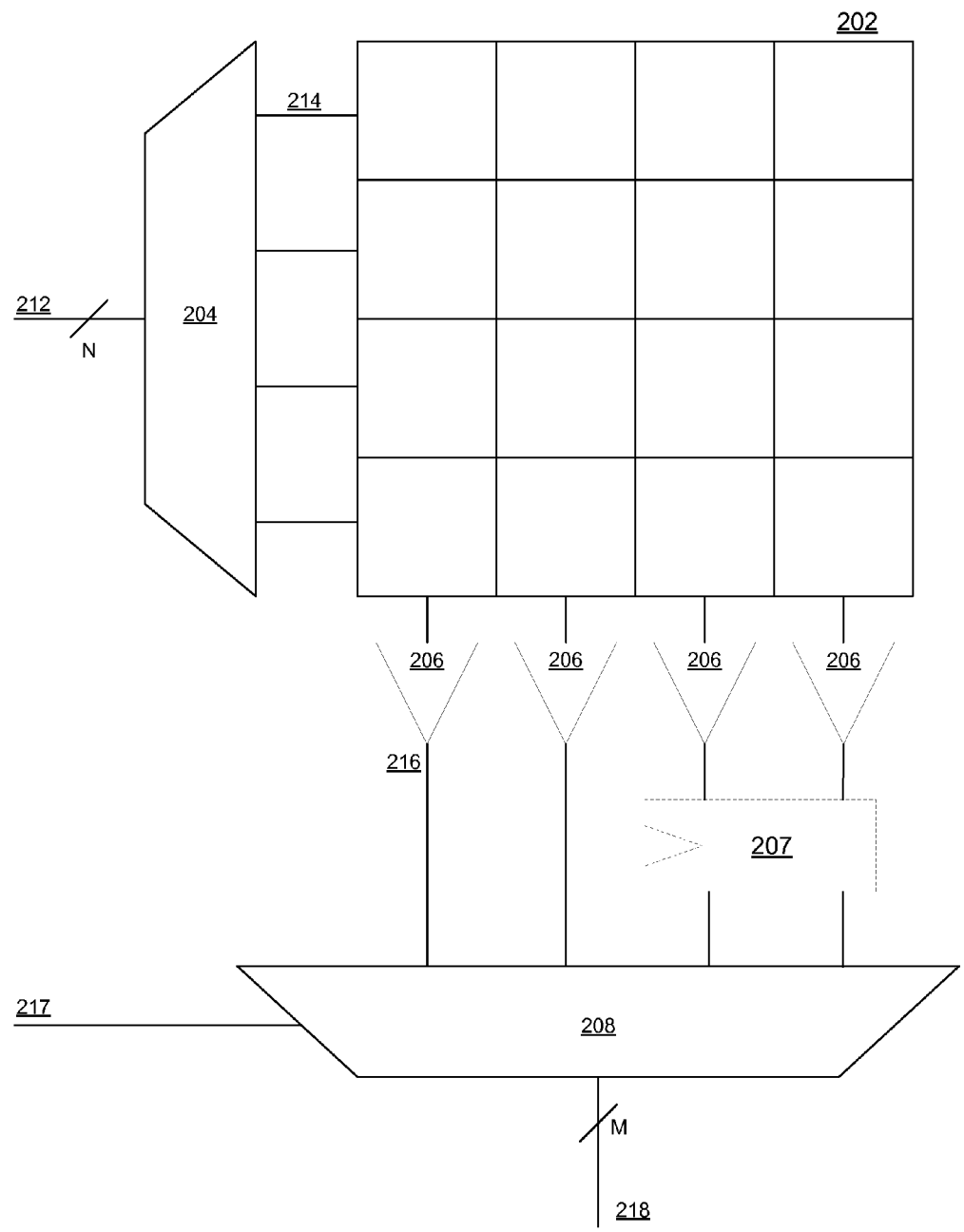
FIG. 2 is a block diagram of an example embodiment of an apparatus in accordance with the disclosed subject matter.

FIG. 2 is a block diagram of an example embodiment of an apparatus or RLUT 200 in accordance with the disclosed subject matter. In the illustrated embodiment, the RLUT 200 may include a sub-array or plurality of memory cells 202 configured to store data. In the illustrated embodiment, the memory cells 202 may store a look-up table that performs a logic function (e.g., a 4-bit adder, etc.).

In various embodiments, the RLUT 200 may receive N signals as inputs 212. In various embodiments, the N input signals 212 may be divided into groups based upon operands of the RLUT 200's logic function. For example, if the input signals 212 include 8-bits, they may be grouped into two 4-bit operands. It is understood that the above is merely one illustrative example to which the disclosed subject matter is not limited.

The inputs 212 may be decoded by a local row decoder 204. In various embodiments, the local row decoder 204 may be configured to activate one or more rows 214 of memory cells 202 based upon the values of the input signals 212. In various embodiments, the local row decoder 204 may use the input signals' 212 values as an address to a row of the memory cells 202.

In the illustrated embodiment, each column of the memory cells 202 may be coupled with a driver 206 configured to output, at a predefined voltage, the values stored in the selected row. In various embodiments, the driver 206 may include a word line driver.

In some embodiments, the RLUT 200 may include one or more registers 207 configured to store output signals of the RLUT 200. For example, in some embodiments, the RLUT 200 may be part of a pipelined architecture in which inputs and/or outputs are generally expected to be stable between the edges of a clock signal. In such an embodiment, the registers 207 may be employed to stabilize or hold the output signal 218 values as required by the pipeline architecture. In the illustrated embodiment, the register 207 is shown between the driver 206 and the local line selector 208. In another embodiment, the register 207 may be placed after the local line selector 208. It is understood that the above is merely one illustrative example to which the disclosed subject matter is not limited.

In some embodiments, the RLUT 200 may include a local line selector 208 configured to select a sub-set 216 of the row of memory cells 202 based upon at least one input signal 217. In such an embodiment, the local line selector 208 may generate the final output signal 218. In the illustrated embodiment, the output signal 218 may include M-bits.

In some embodiments, the value of the input signal 217 may dynamically change. For example, in the case of an adder, the input signal 217 may function as a carry-in bit, and change with each new addition operation. In another embodiment, the input signal 217 may be a relatively consistent value. For example, the RLUT 200 may have word lines of 16 bits, but the desired output signals 218 may only include 5 bits. In such an embodiment, the input signal 217 may be configured to select only the first 5-bits of the 16-bit word. It is understood that the above are merely a few illustrative examples to which the disclosed subject matter is not limited.

In various embodiments, it may be advantageous for the DRAM-based RLUT 200 to be limited to a minimum number of inputs 212 and a minimum number of outputs 218. For example, if the memory cells 202 include an entire sub-array, the number of rows and columns may be relatively large. As such, it may be more efficient to employ a LUT that makes use of most of the sub-array's rows (e.g., input signals 212) and most of the sub-array's columns (e.g., output signals 218). In such an embodiment, a predefined minimum number of inputs/outputs may result in a minimum amount of efficient utilization of the sub-array.

In various embodiments, the utilization of the sub-array may lend the RLUT 200 to arithmetic computing functions (e.g., an adder, etc.) that include a relatively large number of inputs/outputs. Conversely, while the RLUT 200 may be employed for computing functions with a small number of inputs/outputs (e.g., random control logic, etc.) this may not be the most efficient use of the RLUT 200. It is understood that the above is merely one illustrative example to which the disclosed subject matter is not limited.

In one example embodiment, the RLUT 200 may be configured to include a minimum operand width of 4-bits. In such an embodiment, a two operand logic function may include a total input signal 212 width of 8-bits. Likewise, the RLUT 200 may be configured to include a minimum output signal 218 width of 9-bits. In another embodiment, the RLUT 200 may be configured to include a minimum output signal 218 width equal to two times the minimum operand width (e.g., 8-bits, etc.). It is understood that the above is merely one illustrative example to which the disclosed subject matter is not limited.

In various embodiments, the RLUT 200 may be configured such that the number of input signals 212 and/or output signals 218 may be dynamically altered. For example, as the logic function performed by the RLUT 200 is dynamically altered from a first function to a second function, the number of input signals 212, number of operands, and/or number of output signals 218 may also be dynamically altered. In such an embodiment, this alteration may involve selecting a subset of the total possible number of signals 212 and/or 218 as active.

Figure 3A:
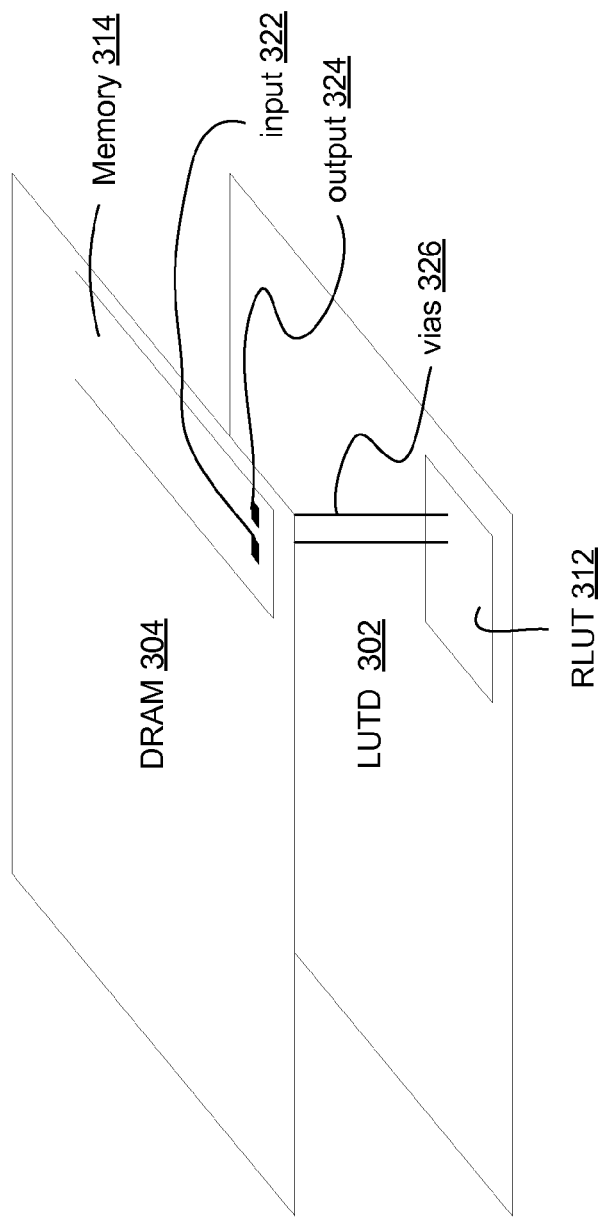
FIG. 3a is an isometric block diagram of an example embodiment of a system in accordance with the disclosed subject matter.

FIG. 3a is an isometric block diagram of an example embodiment of a system 391 in accordance with the disclosed subject matter. In the illustrated embodiment, a number of integrated circuit dies may be stacked (or otherwise) integrated to form a multi-chip system. In various embodiments, this multi-chip system 391 may include an RLUT, as described above.

In various embodiments, a High Bandwidth Memory (HBM) may include a high-performance form of random access memory (RAM). In some embodiments, HBM may include stacked dynamic RAM (DRAM) memory that communicates using through-silicon vias (TSV). Generally, High Bandwidth Memory combines through-silicon vias (TSV) and microbumps to connect multiple (e.g., 4, 8, etc.)

dies of memory cell arrays on top of each other. In some embodiments, a memory controller may be included on a separate die at the very bottom of the stack.

In various embodiments, the system 391 may include a High Bandwidth Memory. In such an embodiment, the system 391 may include a memory controller (not shown), which may be placed at the top or bottom of the stack, or otherwise, depending upon the embodiment. It is understood that the above is merely one illustrative example to which the disclosed subject matter is not limited.

In the illustrated embodiment, the system 391 may include a memory (e.g., DRAM, etc.) die 304 and a LUT die (LUTD) 302. In one embodiment, the memory die 304 and the LUT die 302 may or may not be created or manufactured using the same manufacturing process.

In the illustrated embodiment, the memory die 304 may include a number of memory arrays 314. In such an embodiment, the memory arrays 314 may be configured to store various pieces of data. In some embodiments, the data may be accessed by the LUT die 302.

In the illustrated embodiment, the LUT die 302 may include one or more reconfigurable LUTs (RLUTs) 312. In such an embodiment, the RLUTs 312 may include a memory sub-array that has been configured to store a look-up table that is capable of performing a given logic function, as described above. As described above, in various embodiments, the RLUT 312 may include an interface (shown in FIG. 3c) for accepting write requests to program the memory sub-array to include a look-up table for accelerating and performing logic functions. As described above, in various embodiments, the RLUT 312 may include an interface for accepting read requests to cause the execution for the logic functions stored in the look-up table.

In various embodiments, the RLUT 312 may communicate with the memory 314 using one or more vias 326 (or microbumps, etc.). In such an embodiment, this may allow high speed communication between the processing element (e.g., RLUT 312) and the stored data (memory 314) without the need for communication over a bus or an external interface.

In various embodiments, the memory 314 may include specific interfaces for transmitting inputs 322 to the RLUT 312 and receiving outputs 324 from the RLUT 312. In such an embodiment, the memory 314 may make the input values available to the input interface 322 in response to a read request issued by the RLUT 312. Likewise, the memory 314 may store the output values available to the output interface 324 in response to a write request issued by the RLUT 312. In various embodiments, these read/write requests may include a traditional read/write request as issued by a traditional processor. In another embodiment, the read/write requests may include a request by a traditional processor or the RLUT 312 to make the desired data available using the input interface 322. And likewise, for storing data sent to the output interface 324. It is understood that the above are merely a few illustrative examples to which the disclosed subject matter is not limited.

In various embodiments, the RLUT 312 may be co-located or physically proximate to the accessed memory 314. In such an embodiment, the connection between the two, both in terms of access time and power, may be reduced. Further, the routing required between the two may be reduced. It is understood that the above is merely one illustrative example to which the disclosed subject matter is not limited.

In some embodiments, the LUT die 302 may include one or more memories 314 (not shown on LUT die 302). In such an embodiment, the RLUT 312 may be configured to access data stored either within the memories 314 of the LUT die 302 or the memories 314 of the memory die 304. It is understood that the above is merely one illustrative example to which the disclosed subject matter is not limited.

Figure 3B:
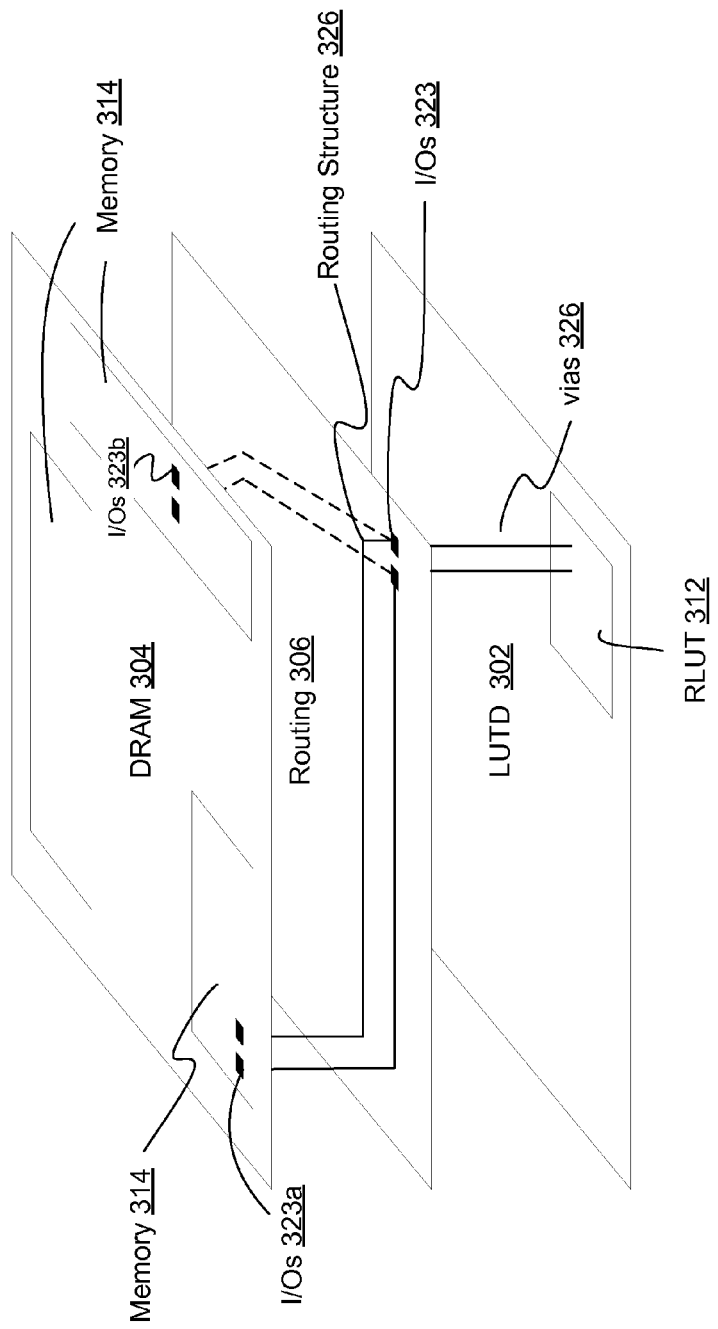
FIG. 3b is an isometric block diagram of an example embodiment of a system in accordance with the disclosed subject matter.

FIG. 3b is an isometric block diagram of an example embodiment of a system 392 in accordance with the disclosed subject matter. In the illustrated embodiment, a number of integrated circuit dies may be stacked (or otherwise) integrated to form a multi-chip system or high-bandwidth memory. In various embodiments, this multi-chip system 392 may include an RLUT, as described above.

In the illustrated embodiment, the system 392 may include a memory (e.g., DRAM, etc.) die 304 and a LUT die 302, as described above. In various embodiments, the memory die 304 may include a plurality of memories 314, each configured to store respective pieces of data. In such an embodiment, the LUT die 302 may include one or more sub-arrays configured as RLUTs 312.

In various embodiments, the system 392 may also include a routing die 306. The routing die 306 may be configured to dynamically route signals between the look-up table die 312 and memory die 304. In various embodiments, the routing die 306 may be coupled with the LUT die 302 by one or more vias 326. The vias 326 (or a portion thereof) may end in input/output (I/O) terminals or interfaces 323. In such an embodiment, the routing die 306 may dynamically route signals between the I/O interfaces 323 and the memories 314 that store the desired data.

In various embodiments, the routing may be accomplished by a routing structure 326. In various embodiments, the routing structure 326 may include various routing devices, such as, for example, multiplexers, de-multiplexers, crossbar switches, switches, rotary switch, memory switch, crossover switch, etc. It is understood that the above are merely a few illustrative examples to which the disclosed subject matter is not limited.

In some embodiments, the routing structure 326 may be configured to route the input/output signals between the I/O interfaces 323 of the RLUT 312 and similar I/O interfaces 323a or 323b of the memories 314. In the illustrated embodiment, two possible routing schemes are shown. For example, the solid line shows a first route that may be employed to connect the RLUT 312 to the I/O interfaces 323a of a first memory (shown in the lower left corner of the memory die 304). In another example, the dashed lines show a second route that may be employed to connect the RLUT 312 to the I/O interfaces 323b of a second memory (shown in the right side of the memory die 304). It is understood that the above are merely a few illustrative examples to which the disclosed subject matter is not limited.

In such an embodiment, the exact routing may differ based upon the logic function performed by the RLUT 312 and the data being accessed. For example, if the data accessed by the RLUT 312 is stored in the first memory, the solid line route may be employed. However, if the data accessed by the RLUT 312 is stored in the second memory, the dashed line route maybe employed instead. In various embodiments, the signal routing may dynamically change in response to a change in the logic function of the RLUT 312 or the data accessed by the RLUT 312.

FIG. 3c is an isometric block diagram of an example embodiment of a system 393 in accordance with the disclosed subject matter. In the illustrated embodiment, a number of integrated circuit dies may be stacked (or otherwise) integrated to form a multi-chip system or high-bandwidth memory. In various embodiments, this multi-chip system 393 may include an RLUT, as described above.

In the illustrated embodiment, the system 393 may include a memory (e.g., DRAM, etc.) die 304 and a LUT die 302, as described above. In various embodiments, the memory die 304 may include a plurality of memories 314, each configured to store respective pieces of data. In such an embodiment, the LUT die 302 may include one or more sub-arrays configured as RLUTs 312.

In the illustrated embodiment, the system 393 may also include a processor die 308. In various embodiments, processor die 308 may include a number of fixed logic circuits 318 that are manufactured to perform substantially dedicated logic functions, and may not be changed in the way the RLUTs 312 may be altered. In various embodiments, the fixed logic circuits 318 may include one or more processor cores. Further, in one embodiment, the processor die 308 may or may not be manufactured using a different process than that employed to create the memory die 304 or the LUT die 302. In some embodiments, the system 393 may include a system-on-a-chip (SoC). It is understood that the above is merely one illustrative example to which the disclosed subject matter is not limited.

In various embodiments, the processor die 308 may establish and utilize the RLUT 312. In such an embodiment, it may write to and read from the RLUT 312 by way of the LUT interface 316 (of the LUT die 302). As described above, in various embodiments, the LUT interface 316 may be configured to accept write requests to program the memory sub-array of the RLUT 312 to include a look-up table for accelerating and performing logic functions. Also as described above, in various embodiments, the LUT interface 316 may be configured to accept read requests to cause the execution for the logic functions stored in the look-up table of the RLUT 312.

In various embodiments, the processor die 308 may include one or more RLUTs 312. In some embodiments, an embodiment of the disclosed subject matter may include a memory die 304 and a processor die 308, where the processor die 308 includes a RLUT 312, and not a separate LUT die 302. In such an embodiment, the processor die 308 may be conceptually viewed as a LUT die 302. It is understood that the above is merely one illustrative example to which the disclosed subject matter is not limited.

FIG. 4 is an isometric block diagram of example embodiments of systems 490, 492, and 494 in accordance with the disclosed subject matter. In the illustrated embodiment, a number of integrated circuit dies may be stacked (or otherwise) integrated to form a multi-chip system or high-bandwidth memory. In various embodiments, the multi-chip systems 490, 492, and 494 may each include an RLUT, as described above.

In the illustrated embodiment, system 490 may include a memory or DRAM die 304, a routing die 306, a LUT die 302 and a logic or processor die 308. In one embodiment, the routing die 306 may be interposed between the memory die 304 and the LUT die 302 so as to facilitate routing signals between the two. In the illustrated embodiment, the processor die 308 may be at the bottom of the stack. In some embodiments, the processor die 308 may be fabricated using a different technology or process from the memory die 304 and LUT die 302. It is understood that the above is merely one illustrative example to which the disclosed subject matter is not limited.

In the illustrated embodiment, system 492 may include a plurality of memory dies 304, a routing die 306, a LUT die 302, and a logic or processor die 308. In one embodiment, the routing die 306 may be interposed between the plurality of memory dies 304 and the LUT die 302 so as to facilitate routing signals between the two. In the illustrated embodiment, the processor die 308 may be at the bottom of the stack. It is understood that the above is merely one illustrative example to which the disclosed subject matter is not limited.

In the illustrated embodiment, system 494 may include a plurality of memory dies 304, a LUT die 302, and a logic or processor die 308. In one embodiment, the routing die 306 may not exist (at least between the memory dies 304 and the LUT die 302). In such an embodiment, the LUT die 302 and memory dies 304 may communicate using straight-through vias or other means. In some embodiments, the LUT die 302 may only communicate with the nearest or adjacent memory die 304. It is understood that the above is merely one illustrative example to which the disclosed subject matter is not limited.

It is understood that the above are merely a few illustrative examples to which the disclosed subject matter is not limited. For example, in another embodiment, multiple routing dies 302 may be employed. For example, a first routing die 306 may exist between the processor die 308 and the LUT die 302, and a second routing die 306 may exist between the memory die 304 and the LUT die 302.

In another embodiment, two or more dies may be sufficiently small to be placed side-by-side instead of stacked. For example, in one embodiment, the processor or logic die 308 and the LUT die 302, together, may be roughly the same size as the memory die 304. In such an embodiment, the processor die 308 and the LUT die 302 may be placed side-by-side on a single level, and the memory die 304 may be placed above or below the two dies 302 and 308. In such an embodiment, data may be co-located or stored proximately to the execution element (e.g., LUT, fixed circuit, etc.) that accesses the data. It is understood that the above is merely one illustrative example to which the disclosed subject matter is not limited.

In various embodiments, applications for the stacked LUT die 302 systems may include, "big data" analytics, databases, high performance computing, etc. In some embodiments, the volume of data processed by the LUT die 302 may be sufficiently large or frequent that close coupling with the data storage (e.g., the memory die 304, etc.) may provide significant advantages. It is understood that the above are merely a few illustrative examples to which the disclosed subject matter is not limited.

Figure 5:
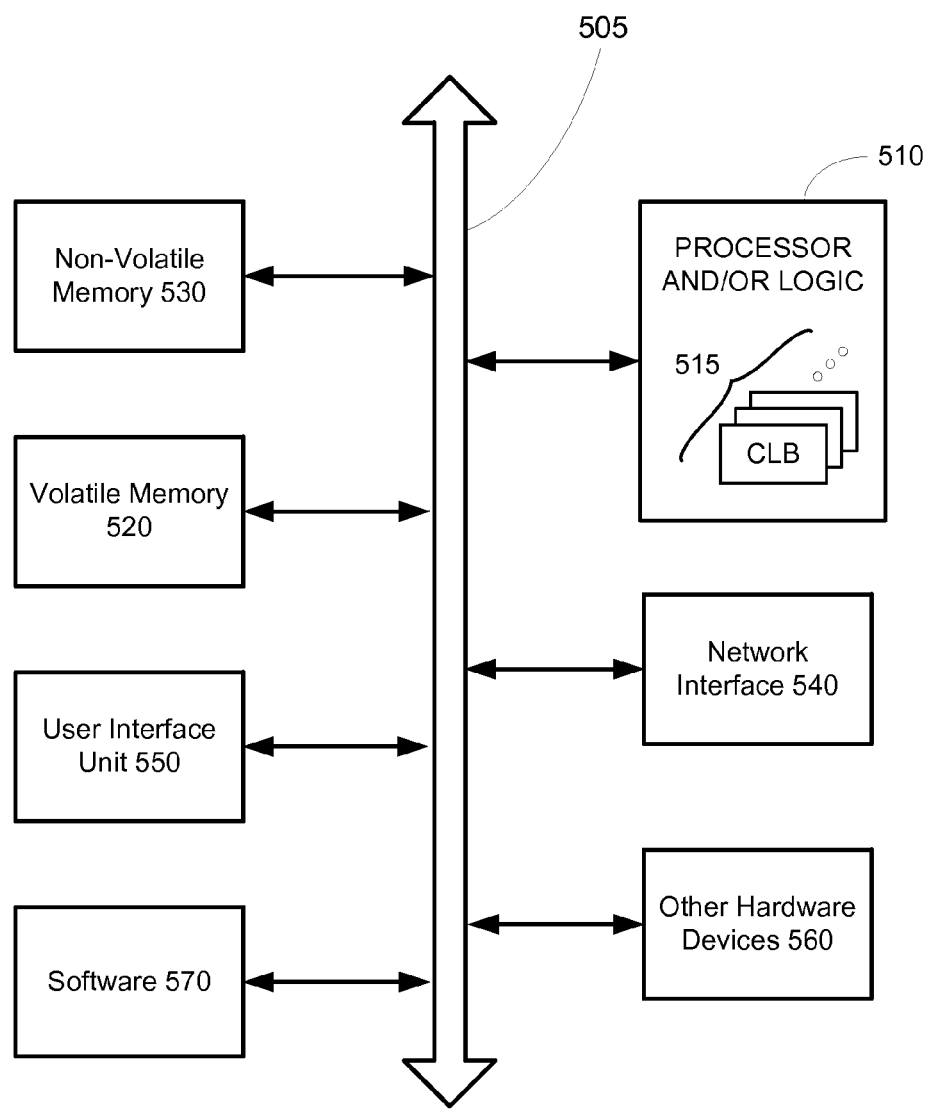
FIG. 5 is a schematic block diagram of an information processing system that may include devices formed according to principles of the disclosed subject matter.

FIG. 5 is a schematic block diagram of an information processing system 500, which may include semiconductor devices formed according to principles of the disclosed subject matter.

Referring to FIG. 5, an information processing system 500 may include one or more of devices constructed according to the principles of the disclosed subject matter. In another embodiment, the information processing system 500 may employ or execute one or more techniques according to the principles of the disclosed subject matter.

In various embodiments, the information processing system 500 may include a computing device, such as, for example, a laptop, desktop, workstation, server, blade server, personal digital assistant, smartphone, tablet, and other appropriate computers, etc. or a virtual machine or virtual computing device thereof. In various embodiments, the information processing system 500 may be used by a user (not shown).

The information processing system 500 according to the disclosed subject matter may further include a central processing unit (CPU), logic, or processor 510. In some embodiments, the processor 510 may include one or more functional unit blocks (FUBs) or combinational logic blocks (CLBs) 515. In such an embodiment, a combinational logic block may include various Boolean logic operations (e.g., NAND, NOR, NOT, XOR, etc.), stabilizing logic devices (e.g., flip-flops, latches, etc.), other logic devices, or a combination thereof. These combinational logic operations may be configured in simple or complex fashion to process input signals to achieve a desired result. It is understood that while a few illustrative examples of synchronous combinational logic operations are described, the disclosed subject matter is not so limited and may include asynchronous operations, or a mixture thereof. In one embodiment, the combinational logic operations may comprise a plurality of complementary metal oxide semiconductors (CMOS) transistors. In various embodiments, these CMOS transistors may be arranged into gates that perform the logical operations; although it is understood that other technologies may be used and are within the scope of the disclosed subject matter.

The information processing system 500 according to the disclosed subject matter may further include a volatile memory 520 (e.g., a Random Access Memory (RAM), etc.). The information processing system 500 according to the disclosed subject matter may further include a non-volatile memory 530 (e.g., a hard drive, an optical memory, a NAND or Flash memory, etc.). In some embodiments, either the volatile memory 520, the non-volatile memory 530, or a combination or portions thereof may be referred to as a "storage medium". In various embodiments, the volatile memory 520 and/or the non-volatile memory 530 may be configured to store data in a semi-permanent or substantially permanent form.

In various embodiments, the information processing system 500 may include one or more network interfaces 540 configured to allow the information processing system 500 to be part of and communicate via a communications network. Examples of a Wi-Fi protocol may include, but are not limited to, Institute of Electrical and Electronics Engineers (IEEE) 802.11g, IEEE 802.11n, etc. Examples of a cellular protocol may include, but are not limited to: IEEE 802.16m (a.k.a. Wireless-MAN (Metropolitan Area Network) Advanced), Long Term Evolution (LTE) Advanced), Enhanced Data rates for GSM (Global System for Mobile Communications) Evolution (EDGE), Evolved High-Speed Packet Access (HSPA+), etc. Examples of a wired protocol may include, but are not limited to, IEEE 802.3 (a.k.a. Ethernet), Fibre Channel, Power Line communication (e.g., HomePlug, IEEE 1901, etc.), etc. It is understood that the above are merely a few illustrative examples to which the disclosed subject matter is not limited.

The information processing system 500 according to the disclosed subject matter may further include a user interface unit 550 (e.g., a display adapter, a haptic interface, a human interface device, etc.). In various embodiments, this user interface unit 550 may be configured to either receive input from a user and/or provide output to a user. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

In various embodiments, the information processing system 500 may include one or more other devices or hardware components 560 (e.g., a display or monitor, a keyboard, a mouse, a camera, a fingerprint reader, a video processor, etc.). It is understood that the above are merely a few illustrative examples to which the disclosed subject matter is not limited.

The information processing system 500 according to the disclosed subject matter may further include one or more system buses 505. In such an embodiment, the system bus 505 may be configured to communicatively couple the processor 510, the volatile memory 520, the non-volatile memory 530, the network interface 540, the user interface unit 550, and one or more hardware components 560. Data processed by the processor 510 or data inputted from outside of the non-volatile memory 530 may be stored in either the non-volatile memory 530 or the volatile memory 520.

In various embodiments, the information processing system 500 may include or execute one or more software components 570. In some embodiments, the software components 570 may include an operating system (OS) and/or an application. In some embodiments, the OS may be configured to provide one or more services to an application and manage or act as an intermediary between the application and the various hardware components (e.g., the processor 510, a network interface 540, etc.) of the information processing system 500. In such an embodiment, the information processing system 500 may include one or more native applications, which may be installed locally (e.g., within the non-volatile memory 530, etc.) and configured to be executed directly by the processor 510 and directly interact with the OS. In such an embodiment, the native applications may include pre-compiled machine executable code. In some embodiments, the native applications may include a script interpreter (e.g., C shell (csh), AppleScript, AutoHotkey, etc.) or a virtual execution machine (VM) (e.g., the Java Virtual Machine, the Microsoft Common Language Runtime, etc.) that are configured to translate source or object code into executable code which is then executed by the processor 510.

The semiconductor devices described above may be encapsulated using various packaging techniques. For example, semiconductor devices constructed according to principles of the disclosed subject matter may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique, a wafer-level processed stack package (WSP) technique, or other technique as will be known to those skilled in the art.

Method steps may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application-specific integrated circuit).

In various embodiments, a computer readable medium may include instructions that, when executed, cause a device to perform at least a portion of the method steps. In some embodiments, the computer readable medium may be included in a magnetic medium, optical medium, other medium, or a combination thereof (e.g., CD-ROM, hard drive, a read-only memory, a flash drive, etc.). In such an embodiment, the computer readable medium may be a tangibly and non-transitorily embodied article of manufacture.

While the principles of the disclosed subject matter have been described with reference to example embodiments, it will be apparent to those skilled in the art that various changes and modifications may be made thereto without departing from the spirit and scope of these disclosed concepts. Therefore, it should be understood that the above embodiments are not limiting, but are illustrative only. Thus, the scope of the disclosed concepts are to be determined by the broadest permissible interpretation of the following claims and their equivalents, and should not be restricted or limited by the foregoing description. It is, therefore, to be understood that the appended claims are intended to cover all such modifications and changes as fall within the scope of the embodiments.

What is claimed is:

1. An apparatus comprising:
a plurality of stacked integrated circuit dies comprising:
a memory cell die configured to store data in a random access fashion; and
a look-up table die comprising a random access memory array that comprises a reconfigurable look-up table configured to perform a logic function and comprises:
a plurality of random access memory cells configured to store a look-up table to perform a logic function,
a local row decoder configured to activate one or more rows of memory cells based upon a set of input signals
a local line selector configured to select a sub-set of values stored in the activated one or more rows of memory and output the selected values as the output of the look-up table, wherein the values, as output, are the same as the values, as stored, and
wherein the look-up table stored in the plurality of memory cells is configured to be dynamically altered via a memory write operation to the random access memory array.

2. The apparatus of claim 1, wherein the plurality of stacked integrated circuit dies comprises a logic die that comprises fixed logic circuits.

3. The apparatus of claim 2, wherein the reconfigurable look-up table is configured to:
receive data from either the memory cell die or the logic die;
perform the logic function on the data, without assistance from the logic die; and
provide an output to either the memory cell die or the logic die.

4. The apparatus of claim 1, wherein the plurality of stacked integrated circuit dies comprises a routing die configured to route signals between the memory cell die and the look-up table die.

5. The apparatus of claim 4, wherein the plurality of stacked integrated circuit dies comprises a plurality of memory cell dies;
wherein the routing die is configured to dynamically route signals between the look-up table die and the plurality of memory cell dies; and
wherein a signal routing provided by the routing die is configured to change in response to a change in the logic function of the look-up table die.

6. The apparatus of claim 1, wherein the memory cell die and the look-up table die are manufactured by a same fabrication technology.

7. The apparatus of claim 1, wherein the memory cell die includes a high bandwidth memory.

8. The apparatus of claim 1, wherein the memory cell die and look-up table die are electrically coupled by through-silicon vias.

9. The apparatus of claim 1, wherein the reconfigurable look-up table is physically located on the look-up table die so as to be physically proximate to a portion of the memory cell die that stores data processed by the reconfigurable look-up table.

10. A system-on-a-chip (SoC) comprising:
a look-up table die comprising a reconfigurable look-up table configured to perform a logic function and comprising:
a plurality of random access memory cells configured to store a look-up table to perform a logic function by, at least in part, outputting as a resultant of the logic function at least a sub-set of values stored in an activated one or more rows of the random access memory cells, wherein the values, as output, are the same as the values, as stored, wherein the look-up table is configured to be dynamically altered by a memory write operation to the random access memory cells; and
a processor die comprising a processor core, wherein the processor core is configured to off-load an execution of the logic function to the reconfigurable look-up table.

11. The system-on-a-chip of claim 10, wherein the look-up table die and processor die are electrically coupled by through-silicon vias.

12. The system-on-a-chip of claim 10, further comprising a memory cell die configured to store data in a random access fashion.

13. The system-on-a-chip of claim 12, wherein the reconfigurable look-up table is configured to:
receive data from either the memory cell die or the processor die;
perform the logic function on the data, without assistance from the processor die; and
provide an output to either the memory cell die or the processor die.

14. The system-on-a-chip of claim 12, wherein the memory cell die, the look-up table die, and the processor die are stacked with each other.

15. The system-on-a-chip of claim 10, further comprising:
a memory cell die, and a routing die; and
wherein the routing die is configured to route signals between the memory cell die and the look-up table die.

16. The system-on-a-chip of claim 15, wherein the routing die is configured to dynamically route signals between the look-up table die and the memory cell die, based upon a selected logic function of the look-up table die and a location of data accessed by the reconfigurable look-up table.

17. The system-on-a-chip of claim 10, wherein the look-up table die comprises a memory array configured to store data in a random access fashion; and
wherein the processor core is configured to:
read input data from the memory array,
write the input data to an input interface of the reconfigurable look-up table, and read, from an output interface of the reconfigurable look-up table, output data generated as part of executing the logic function.

18. A method comprising:

manufacturing, by a first fabrication technology, a memory cell die configured to store data in a random access fashion;

manufacturing, by a second fabrication technology, a look-up table die comprising a reconfigurable look-up table configured to perform a logic function and comprising:

a plurality of random access memory cells configured to store a look-up table to perform a logic function by, at least in part, outputting as a resultant of the logic function at least a sub-set of values stored in an activated one or more rows of the random access memory cells, wherein the values, as output, are the same as the values, as stored, wherein the look-up table is configured to be dynamically altered by a memory write operation to the random access memory cells; and physically coupling the memory cell die and the look-up table die into a stack of integrated circuit dies.

19. The method of claim 18, further comprising:

manufacturing, by a third fabrication technology, a processor die comprising a processor core that is configured to off-load an execution of the logic function to the reconfigurable look-up table; and physically coupling the memory cell die, the look-up table die, and the processor die into a stack of integrated circuit dies.

20. The method of claim 19, wherein the first fabrication technology, the second fabrication technology, and the third fabrication technology, are selected from a group consisting of two different kinds of fabrication technologies.

21. The method of claim 18, further comprising:

manufacturing a routing die configured to dynamically route signals between the look-up table die and the memory cell die, based upon a selected logic function of the look-up table die and a location of data accessed by the reconfigurable look-up table; and physically coupling the memory cell die, the look-up table die, and the routing die into a stack of integrated circuit dies.

* * * * *